US012671396B2

(12) United States Patent
Mangalore Anand et al.

(10) Patent No.: US 12,671,396 B2
(45) Date of Patent: Jun. 30, 2026

(54) GLITCH-FREE POWER SUPPLY INDEPENDENT SEQUENCE CIRCUIT

(71) Applicant: Advanced Micro Devices, Inc., Santa Clara, CA (US)

(72) Inventors: Rajesh Mangalore Anand, Bangalore (IN); Aniket Bharat Waghide, Bangalore (IN); Dhruvin Devangbhai Shah, Ahmedabad (IN); Shajo Mathew Vettathu, Pin (IN); Shreevatsa M, Bangalore (IN); Jagadeesh Anathahalli Singrigowda, Bangalore (IN); Girish A S, Bangalore (IN)

(73) Assignee: Advanced Micro Devices, Santa Clara, CA (US)

( * ) Notice: Subject to any disclaimer, the term of this patent is extended or adjusted under 35 U.S.C. 154(b) by 0 days.

(21) Appl. No.: 18/772,977

(22) Filed: Jul. 15, 2024

(65) Prior Publication Data

US 2026/0019066 A1 Jan. 15, 2026

(51) Int. Cl.
| | |
|---|---|
| *H03K 17/00* | (2006.01) |
| *H03K 3/013* | (2006.01) |
| *H03K 3/037* | (2006.01) |
| *H03K 17/687* | (2006.01) |
| *H03K 19/0175* | (2006.01) |

(52) U.S. Cl.
CPC ............. *H03K 3/013* (2013.01); *H03K 3/037* (2013.01); *H03K 17/6872* (2013.01); *H03K 19/017509* (2013.01)

(58) Field of Classification Search
CPC .... G05F 1/10; G05F 1/04; G05F 1/56; H03K 3/013; H03K 3/037; H03K 17/6872; H03K 19/017509
See application file for complete search history.

(56) References Cited

U.S. PATENT DOCUMENTS

| | | | | |
|---|---|---|---|---|
| 10,107,578 | B1 * | 10/2018 | Mirabel | .................... F41A 9/60 |
| 12,212,315 | B1 * | 1/2025 | Kumar | ................... H03K 3/011 |
| 2021/0004030 | A1 * | 1/2021 | Chang | .................... H03K 3/037 |
| 2021/0257908 | A1 * | 8/2021 | Gonzalez Santos | .. H02M 3/157 |
| 2024/0213968 | A1 * | 6/2024 | Kumar | ................... H03K 17/16 |

* cited by examiner

*Primary Examiner* — Tuan T Lam
(74) *Attorney, Agent, or Firm* — Slater Matsil, LLP

(57) ABSTRACT

A glitch removal circuit is configured to receive a first voltage and a detection signal indicating the status of a second voltage that is lower than the first voltage. The glitch removal circuit outputs a missing low-voltage signal when the first voltage is present and the second voltage is absent. The glitch removal circuit may be incorporated into a power check circuit of a power supply independent sequence system, such as by modifying one or more power ok signals that are sent to an input/output circuit of the system. The input/output circuit may include a power mux circuit coupled to a selection signal generated by the power check circuit. The power mux circuit may be configured to output an intermediate voltage between the first voltage and a reference ground voltage generated from the first voltage of the second voltage according to the selection signal.

20 Claims, 7 Drawing Sheets

VDDH

~214

Glitch Removal Circuit 202

Voltage
Divider
222

LOCAL_CRV

~223

VDDL

~213

VTDC
206

221

225

Latch Circuit
226

220

NO_VDDL

215

VT_DETECT

GLITCH-FREE POWER SUPPLY INDEPENDENT SEQUENCE CIRCUIT

TECHNICAL FIELD

The present invention relates generally to electronic circuits, and, in particular implementations, to power supply independent sequence systems and electronic circuits with at least two voltage domains at different voltage levels.

BACKGROUND

Electronic circuits include a variety of difference electronic components that require electrical power to function. Electrical power is typical supplied at specific voltage levels to various components throughout an electronic circuit. Electronic components that are all designed to function at similar supply voltages may be grouped into voltage domains. For example, in a multi-voltage electronic system, there may exist at least two voltage domains at different voltage levels. Components that are designed to operate at a lower voltage (i.e., low-voltage circuitry) may be damaged if exposed to a higher voltage. For this reason, isolation circuitry may be included to prevent the low-voltage circuitry from being exposed to the higher voltage.

The order in which the high-voltage supply and low-voltage supply is provided to components of the electronic circuit may impact the voltages that the components experience across various terminals. Some systems are designed to only protect the components when the high-voltage supply and the low-voltage supply are provided in a predetermined order. For example, some electronic systems require the low voltage be delivered first and then the high voltage when the power to the electronic system is turned on (and the reverse when the electronic system is turned off). Alternatively, electronic systems may include circuitry that allows power to be delivered to the electronic system in any order: a power supply independent sequence (PSIS) system.

BRIEF DESCRIPTION OF THE DRAWINGS

For a more complete understanding of the present invention, and the advantages thereof, reference is now made to the following descriptions taken in conjunction with the accompanying drawings, in which.

Figure 1:
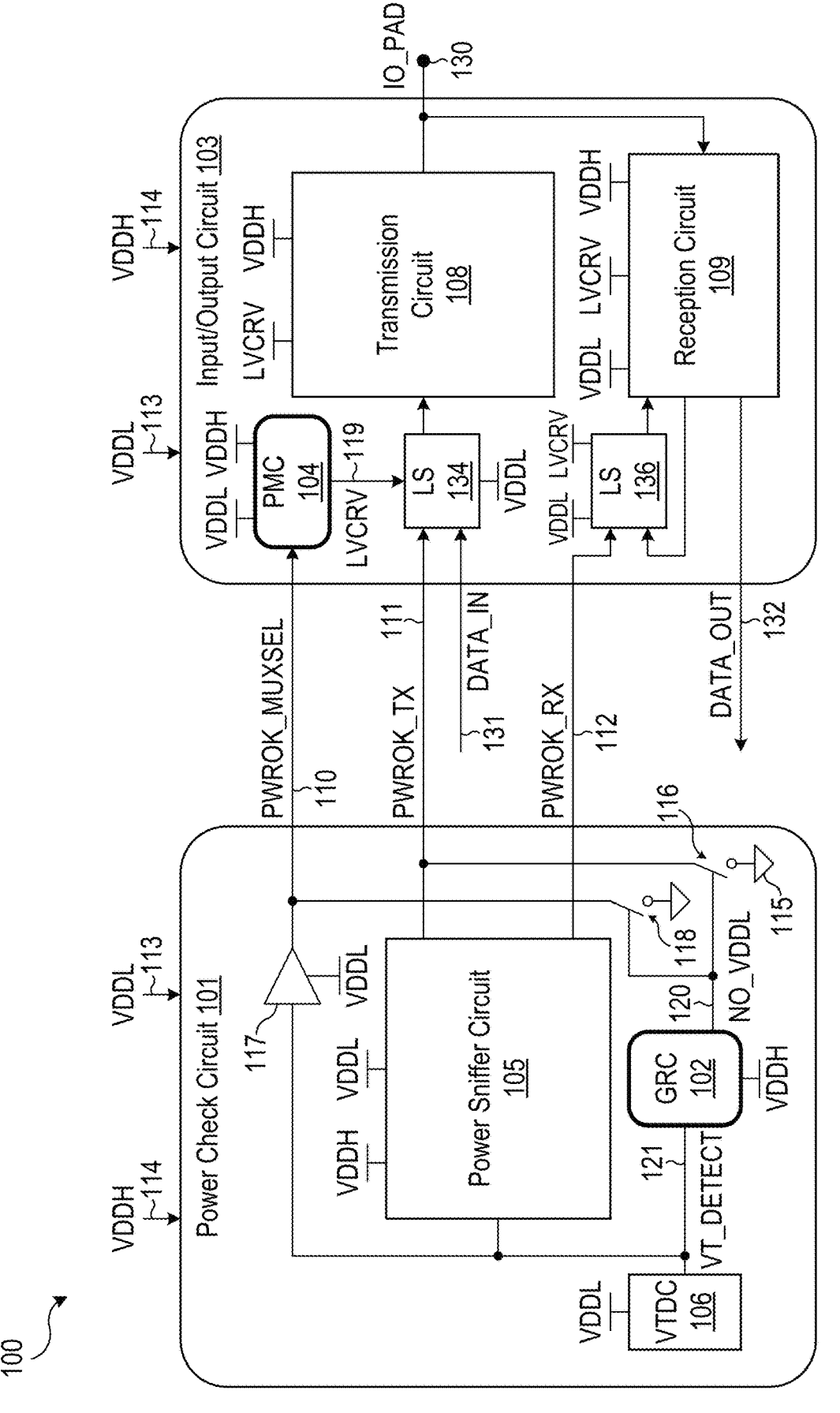
FIG. 1 illustrates an example PSIS system that includes a power check circuit with a glitch removal circuit configured to provide a missing low-voltage signal to a power mux circuit of an input/output circuit, the missing low-voltage signal indicating that a high voltage is present and a low voltage is absent in accordance with implementations of the invention.

Corresponding numerals and symbols in the different figures generally refer to corresponding parts unless otherwise indicated. The figures are drawn to clearly illustrate the relevant aspects of the implementations and are not necessarily drawn to scale. The edges of features drawn in the figures do not necessarily indicate the termination of the extent of the feature.

DETAILED DESCRIPTION OF ILLUSTRATIVE IMPLEMENTATIONS

The making and using of various implementations are discussed in detail below. It should be appreciated, however, that the various implementations described herein are applicable in a wide variety of specific contexts. The specific implementations discussed are merely illustrative of specific ways to make and use various implementations, and should not be construed in a limited scope. Unless specified otherwise, the expressions "around", "approximately", and "substantially" signify within 10%, and preferably within 5% of the given value or, such as in the case of substantially zero, less than 10% and preferably less than 5% of a comparable quantity.

In systems where high-voltage applications are supported in the same environment as low-voltage tolerant devices, the low-voltage devices can experience overvoltage stress. That is, without circuitry specifically designed to avoid overvoltage stress, the low-voltage devices can experience voltages outside their voltage tolerance when the high voltage is supplied to other devices. Overvoltage stress of the low-voltage devices can cause various reliability issues, such as hot carrier injection, gate-oxide breakdown, and others, especially when the devices are subjected to the stress repeatedly or for long periods of time.

The problem of overvoltage stress on low-voltage devices worsens in advanced technology nodes (such as 5 nm, where the foundry supports only 1.2 V thick-oxide devices which can be overdriven to 1.5V, to support 1.8 V or 3.3 V systems, for example). A low-voltage transistor may operate at 1.2 V and be tolerant to voltages up to 1.5 V. In a system that includes a high voltage, such as 1.8 V, the low-voltage transistor may experience 1.8 V gate voltage while the source or drain voltages remain at zero. In this scenario, one or both of the gate-drain voltage ($V_{GD}$) and the gate-source voltage ($V_{GS}$) is 1.8 V (higher than 1.5 V), which puts overvoltage stress on the transistor. Conversely, the gate voltage may be zero while the source or drain voltages experience 1.8 V causing one or both of the source-gate voltage ($V_{SG}$) and the drain-gate voltage ($V_{DG}$) to be 1.8 V, which is also higher than 1.5 V.

Power supply sequence (PSS) dictates the order of activating multiple power supplies in an electronic circuit (such as an integrated circuit or IC) to prevent damage and ensure proper functionality. PSS places undesirable restrictions on the environment in which the input/output circuits will be used. In a power sequence independent sequencing (PSIS) system, the high-voltage supply may be turned on first, which can lead to low-voltage devices experiencing the full high voltage (relative to a reference ground voltage) until the low-voltage supply is turn on. PSIS systems may allow cost reductions (from using fewer materials, simplifying design, etc.) without adversely affecting system operation.

Low-voltage devices may be subject to overvoltage stress is during PSIS in multi-voltage input/output (I/O) circuits, such as general purpose input/output (GPIO) circuit used as a data interface between circuitry of different voltage levels. One specific example is a multi-voltage I.O where a 1.8 V I/O supply (VDD18) is present. A multi-voltage I/O circuit may be used in various systems, such as system on chip (SoC) systems to provide a data interface between a core circuit (e.g., low-voltage devices) and external circuitry. Of course, the challenge of avoiding voltage overstress of low-voltage devices may be present in any system that has components powered by a lower voltage supply that are not tolerant to higher voltages supplied to other components.

As technology nodes continue to shrink, devices are also becoming more complicated, more sensitive to voltages, and operate at lower voltages. This increases the importance of mitigating or preventing overvoltage stress. For example, low-voltage circuitry in a core circuit may now include devices fabricated at a 5 nm technology node, a 3 nm technology node, a 2 nm technology node, etc. Therefore, circuits designed to address device overvoltage stress that can be implemented in a 5 nm technology node (or lower) are desirable.

In various implementations, the invention proposes to preserve PSIS capability while preventing overvoltage stress on devices by including a glitch removal circuit that outputs a missing low-voltage signal when a high voltage supply is present and a low voltage supply is absent. A power mux circuit may also be used in combination with the glitch removal circuit to choose when to generate an intermediate voltage from the high voltage supply or the low voltage supply. The proposed circuit may advantageously assist multi-voltage circuits (such as multi-voltage I/O circuits) in defining nodes (e.g., I/O pad, data output, core output, etc.) to known states during PSIS. The prevention of overvoltage stress may also advantageously improve the aging and reliability of the low-voltage tolerant devices.

The glitch removal circuit may be incorporated into a power check circuit of a PSIS system, such as by modifying one or more power ok signals that are sent to an input/output circuit of the system. The input/output circuit may include a power mux circuit coupled to a selection signal generated by the power check circuit. The power mux circuit may be configured to output an intermediate voltage between the first voltage and a reference ground voltage generated from the first voltage of the second voltage according to the selection signal.

In various implementations, the proposed circuits may be used in I/O clusters to advantageously improve circuit functionality and device reliability conditions while operating at high-voltage applications. The functionality of the proposed circuits may also have the advantage of maintained compliance with associated I/O standards, like EIA/JESD8-7 and LVCMOS18. The proposed circuits may be implemented in a 5 nm technology node (e.g., targeted for 1.8 V supply range interface standards for unterminated ICs), and may have the benefit of being scalable to lower technology nodes.

The proposed circuits may also enhance reliability as well as mitigating or preventing both signal misinterpretation and electrical stress for better overall stability. In the specific context of a PSIS system that includes an input/output circuit, the proposed circuit may have the advantages of preventing an undefined I/O pad, preventing the propagation of undesired values (undesirable "X" propagation) through the I/O pad during transmission when the high-voltage supply (VDDH) is present, but the low-voltage supply (VDDL) is absent. For example, when VDDL is powered down, the input from low-voltage circuitry (e.g., core logic) to the I/O circuit can be an unknown value. In such cases, the I/O circuit can receive signal glitches and an unknown logic value from the (core) input may propagate to the I/O pad, which provides a false value to the I/O interface. The proposed circuits may advantageously provide glitch-free and seamless operation in PSIS scenarios. The proposed circuits may also have the benefit of aiding in isolating the current paths between supplies during PSIS. The complexity of handling power sequencing in a power management IC (PMIC) during validation may also advantageously be reduced.

The proposed circuits may also be usable in a variety of other contexts. For example, some field-programmable gate array (FPGA) and analog-to-digital converter (ADC) applications have power-on reset (POR) circuits that operate using multiple voltage rails. To minimize the inflow current during power sequencing and reduce electrical stress on devices, the proposed circuits (such as the power mux circuit) and provide the benefit of power isolating internal circuits and generating intermediate voltages to prevent current flow between any two supplies and improve reliability of devices, respectively.

Implementations provided below describe various electronic circuits, and in particular, PSIS systems that include a power check circuit with a glitch removal circuit configured to output a missing low-voltage signal to generate a selection signal received by a power mux circuit of an input/output circuit where the power mux circuit is configured to output an intermediate voltage between a high voltage and reference ground voltage independent of the power supply sequence. The following description describes the implementations. FIG. 1 is used to describe an example PSIS system. Two example glitch removal circuits are described using FIGS. 2 and 3. A timing diagram of an example glitch removal circuit is described using FIG. 4. Two example power mux circuits are described using FIGS. 5 and 6. A timing diagram of an example power mux circuit is described using FIG. 7. Another example PSIS system is described using FIG. 8 while a flowchart of the behavior of an example PSIS system is described using FIG. 9.

FIG. 1 illustrates an example PSIS system that includes a power check circuit with a glitch removal circuit configured to provide a missing low-voltage signal to a power mux circuit of an input/output circuit, the missing low-voltage signal indicating that a high voltage is present and a low voltage is absent in accordance with implementations of the invention.

Referring to FIG. 1, a PSIS system 100 includes a power check circuit 101 and an input/output circuit 103. The PSIS system 100 includes one or more electronic circuits that have components designed to operate in at least two different voltage regimes. Specifically, the PSIS system 100 includes at least two power supplies at different voltage levels (i.e., a so-called "low" voltage and a so-called "high" voltage that are labeled as such based on their relation to one another). In various implementations, the high voltage is double the low voltage. In one implementation, the high voltage is about 1.8 V and the low voltage is about 0.9 V, but of course other voltage levels are possible. As discussed above the circuit configurations described herein are scalable to be usable in systems with a variety of voltage requirements (e.g., low-voltage circuitry, which may be core circuitry, that is manufactured at different technology nodes, such as 5 nm, 3 nm, and lower).

Both the power check circuit 101 and the input/output circuit 103 include a low-voltage input 113 and a high-voltage input 114. That is, the PSIS system 100 is configured to receive or generate a low-voltage supply and a high-voltage supply that each are provided to the power check circuit 101 and the input/output circuit 103 and then to various components therein. The low-voltage input 113 and the high-voltage input 114 are shown to indicate as much; the exact circuit implementation providing the low voltage (VDDL, such as a 0.9 V core supply VDDC) and the high voltage (VDDH, such as a 1.8 V supply VDD18) to the various components may depend on the specific details of a given application. The power check circuit 101 is configured to check the status of both the high voltage and the low voltage and indicate to the input/output circuit 103 whether to enable or disable communication circuitry (i.e., convey whether the delivered power is "good" in the context of the operational needs of the input/output circuit 103).

The input/output circuit 103 may act as an interface between circuitry (e.g., circuitry of different circuit blocks, devices, voltage domains, etc.) by facilitating data communication therebetween. In some implementations, the input/output circuit 103 is a GPIO circuit, such as a 1.8 V GPIO in one implementation. For example, the input/output circuit 103 may include an input/output pad 130 (IO_PAD) that is configured to transmit and receive data (e.g., from a high-voltage domain, such as a 1.8 V domain, for example). Accordingly, the input/output circuit 103 may also include a data input 131 and a data output 132 that are configured to receive and transmit data, respectively, from another voltage domain (e.g., from a low-voltage domain, such as a 0.9 V domain, for example).

The power check circuit 101 outputs one or more "power ok" signals to the input/output circuit 103 based on the received low voltage and high voltage. For example, the power check circuit 101 may generate and output a power ok transmission signal 111 (PWROK_TX) to the input/output circuit 103 to indicate whether it is safe to enable a transmission circuit 108 included in the communication circuitry. Similarly, the power check circuit 101 may generate and output a power ok reception signal 112 (PWROK_RX) to the input/output circuit 103 to indicate whether it is safe to enable a reception circuit 109 included in the communication circuitry. A power sniffer circuit 105 of the power check circuit 101 may generate the power ok transmission signal 111 and the power ok reception signal 112, such as by monitoring VDDH and VDDL.

As discussed in the foregoing, in the absence of additional circuitry, the input/output circuit 103 may allow low-voltage circuitry (e.g., a core circuit) to experience high voltage through the input/output circuit 103 when power is delivered in certain sequence(s) (e.g., when the high voltage is delivered before the low voltage). Therefore, the power check circuit 101 of the PSIS system 100 also includes a glitch removal circuit 102 configured to remove so-called "glitches" that occur when power is delivered in a different order. The glitch removal circuit 102 may aid in suppressing one or more of the power ok signals (which may be in the low-voltage domain) from becoming unknown (i.e., 1'bX) or from propagating undesired glitches in the absence of the low-voltage supply during PSIS. Within the PSIS system 100, the glitch removal circuit 102 works to stop I/O signal transmission during power supply sequences. Specifically, the glitch removal circuit 102 is configured to output a missing low-voltage signal 120 (NO_VDDL) when the high voltage (VDDH) is present, but the low voltage (VDDL) is absent.

The glitch removal circuit 102 has a detected-voltage input 121 configured to be coupled to a detection signal (VT_DETECT) indicating that a voltage has been detected. For example, the detection signal may be in a certain state (e.g., high) when the voltage at the detected-voltage input 121 is at or above a predetermined threshold. The glitch removal circuit 102 uses the detection signal to generate NO_VDDL. In one implementation, the detected-voltage input 121 of the glitch removal circuit 102 is coupled to a voltage threshold detection circuit 106 that is configured to generate VT_DETECT when the low voltage (VDDL) meets or exceeds the predetermined threshold. Conversely, VT_DETECT may be zero (i.e., a reference ground voltage; "low") until VDDL is at or above the predefined threshold. For example, the predetermined may be a voltage about halfway between the nominal voltage of VDDL (e.g., 0.9 V) and a reference ground potential. Of course, the predetermined threshold may also be higher or lower.

As part of the one or more power ok signals, the power check circuit 101 also generates and outputs a selection signal 110 (PWROK_MUXSEL) that is used by the input/output circuit 103. In this specific example, the selection signal 110 is generated from the detection signal VT_DETECT, which is passed through a buffer 117 powered by the low voltage VDDL. The one or more power ok signals are modified by the glitch removal circuit 102. Specifically, the missing low-voltage signal 120 NO_VDDL is coupled to the control input of at least one switch coupled between a power ok signal and a reference ground voltage 115.

In this specific example, NO_VDDL is coupled to an ok transmission switch 116 and a mux selection switch 118 that are configured to function as pull-down switches for PWROK_TX (the power ok transmission signal 111) and PWROK_MUXSEL (the selection signal 110), respectively. The result is that PWROK_TX and PWROK_MUXSEL become low when NO_VDDL is high (i.e., when VDDH is present and VDDL is not). Of course, the inclusion of a switch may be based on the use of the signal by the input/output circuit 103 in a specific application and more or fewer switches may be coupled to NO_VDDL in other implementations.

The input/output circuit 103 includes a power mux circuit 104 that is coupled to the PWROK_MUXSEL (the selection signal 110). The power mux circuit 104 is also coupled to both the low voltage VDDL and the high voltage VDDH and is configured to generate an intermediate voltage (LVCRV) at a power output 119. The intermediate voltage is at a voltage level between the high voltage VDDH and the reference ground voltage. Depending on the state of PWROK_MUXSEL, the power mux circuit 104 may generate the LVCRV using VDDH or VDDL. In this way, the power mux circuit 104 may generate the intermediate voltage when one or both of VDDH and VDDL are present advantageously preventing the full voltage difference between the reference ground voltage and the high voltage from being experienced by low-voltage circuitry. In particular, the power mux circuit 104 may play a role in reducing reliability issues when the high-voltage supply is present and the low-voltage supply is absent by generating LVCRV from the VDDH.

Prevent of leakage current at the I/O interface can also be important. For example, propagation of faulty power ok signals during power sequencing can lead to leakage in the output driver if the internal nets are not settled properly. This may cause an undesirable voltage to drop in the rest of the circuit and can lead to the malfunction of designs operating on the high-voltage domain. Additionally, if the leakage current is higher than the default input current value (e.g., 10 μA as per JEDEC JESD8-7 standard) the voltage levels received by end systems may be adversely affected. The combination of the glitch removal circuit 102 and the power mux circuit 104 in the PSIS system 100 may have the benefit of keeping current leakage (e.g., at the input/output pad 130) under control as the pad value is defined to a known value in all possible power sequencing scenarios.

The input/output circuit 103 may include a transmission level shifter circuit 134 coupled to the data input 131 and PWROK_TX (the power ok transmission signal 111). The transmission level shifter circuit 134 may be configured to be disabled when PWROK_TX is in a specific state (e.g., low). When enabled, the transmission level shifter circuit 134 may be configured to shift the voltage level of the data signal received by the data input 131 (DATA_IN) from the low voltage (e.g., core voltage) to the intermediate voltage (LVCRV) received from the power output 119.

Similarly, the input/output circuit 103 may also include a reception level shifter circuit 136 coupled to the data output 132 and PWROK_RX (the power ok reception signal 112) and that is configured to be disabled when PWROK_RX is in a specific state, such as low. In contrast to the transmission level shifter circuit 134, the reception level shifter circuit 136 may be configured to shift the voltage level of the data signal received by the data output 132 (DATA_OUT) from the intermediate voltage (LVCRV) to the low voltage (e.g., because output of the reception level shifter circuit 136 faces the low-voltage circuitry).

Figure 2:
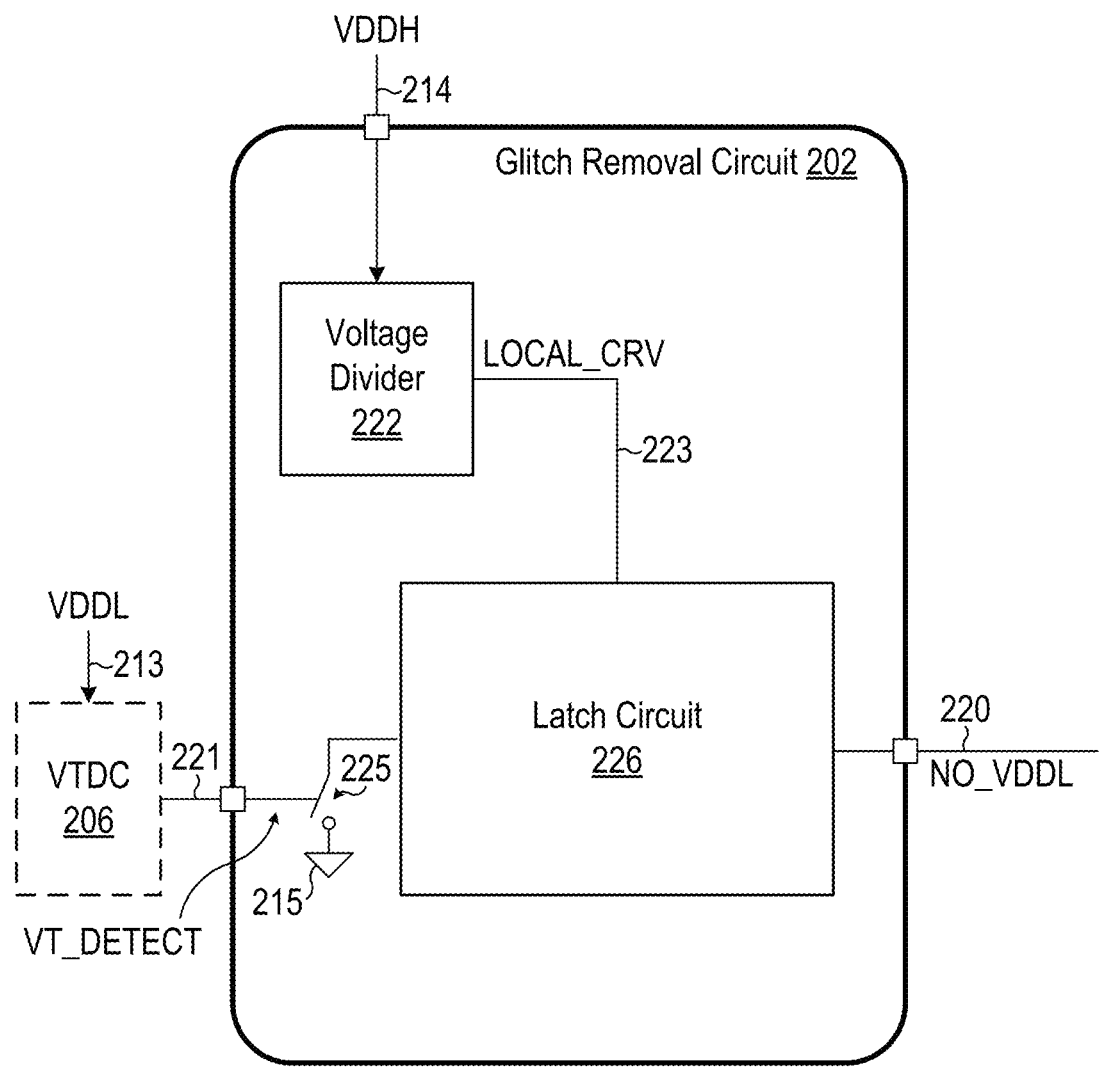
FIG. 2 illustrates an example glitch removal circuit that includes a voltage divider circuit configured to generate an internal voltage from supply voltage received at a high-voltage input and output the internal voltage when the voltage received at a detected-voltage input is zero in accordance with implementations of the invention.

FIG. 2 illustrates an example glitch removal circuit that includes a voltage divider circuit configured to generate an internal voltage from supply voltage received at a high-voltage input and output the internal voltage when the voltage received at a detected-voltage input is zero in accordance with implementations of the invention. The glitch removal circuit of FIG. 2 may be specific implementation of other glitch removal circuits describe herein, such as the glitch removal circuit of FIG. 1, for example. Similarly labeled elements may be as previously described.

Referring to FIG. 2, a glitch removal circuit 202 includes a voltage divider circuit 222 coupled to a high-voltage input 214 and a detected-voltage input 221 configured to receive a detection signal (VT_DETECT) indicating that a low voltage that is at or above a predetermined threshold has been detected. As before, the high-voltage input 214 is configured to receive a high voltage supply while VT_DETECT indicates the presence or absence of a low voltage supply, the labels of high and low being relative to one another (as opposed to particular values). The glitch removal circuit 202 is again configured to output a missing low-voltage signal 220 (NO_VDDL) when the high voltage (VDDH) is present, but the low voltage (VDDL) is absent.

It should be noted that here and in the following a convention has been adopted for brevity and clarity wherein elements adhering to the pattern [x02] where 'x' is the figure number may be related implementations of a glitch removal circuit in various implementations. For example, the glitch removal circuit 202 may be similar to the glitch removal circuit 102 except as otherwise stated. An analogous convention has also been adopted for other elements as made clear by the use of similar terms in conjunction with the aforementioned numbering system.

The voltage divider circuit 222 is configured to generate an internal voltage 223 (LOCAL_CRV) from VDDH and output the internal voltage 223 to a latch circuit 226 (e.g., a circuit configured to maintain a received signal over some length of time). The internal voltage 223 is lower than VDDH (e.g., an intermediate voltage between VDDH and a reference ground voltage, such as about half VDDH and is about 0.9 V in one implementation). The latch circuit 226 is configured to output a missing low-voltage signal 220 (NO_VDDL) based on LOCAL_CRV and VT_DETECT. For example, NO_VDDL may be low when both VDDH and VDDL are present, or at least above a certain threshold), NO_VDDL may be undefined when there is no power and when only VDDL is present, and NO_VDDL may be high when VDDL is absent and VDDH is present (because there is power, but VDDL is missing).

Specifically, the detection signal VT_DETECT is coupled to control input of a voltage detection switch 225. The voltage detection switch 225 is coupled between the detected-voltage input 221 and a reference ground voltage 215. The voltage detection switch 225 is configured to function as a pull-down switch that is controlled by VT_DETECT so that when VT_DETECT is high, the voltage detection switch 225 closes pulling NO_VDDL low. In various implementations, the voltage detection switch 225 is a transistor, and is an NMOS transistor in one implementation.

A voltage threshold detection circuit 206 (such as similar to the voltage threshold detection circuit 106 of FIG. 1, for example) may be coupled to the detected-voltage input 221 and configured to generate the detection signal from a low-voltage input 213 that is configured to receive the low voltage VDDL. Since the voltage threshold detection circuit 206 may in some cases output the detection signal to other circuitry (in a PSIS system, for example), the voltage threshold detection circuit 206 is drawn with dashed lines as being separate from the glitch removal circuit 202. Of course, in some implementations, the voltage threshold detection circuit 206 may be considered to be part of the glitch removal circuit 202.

Figures 3, 4:
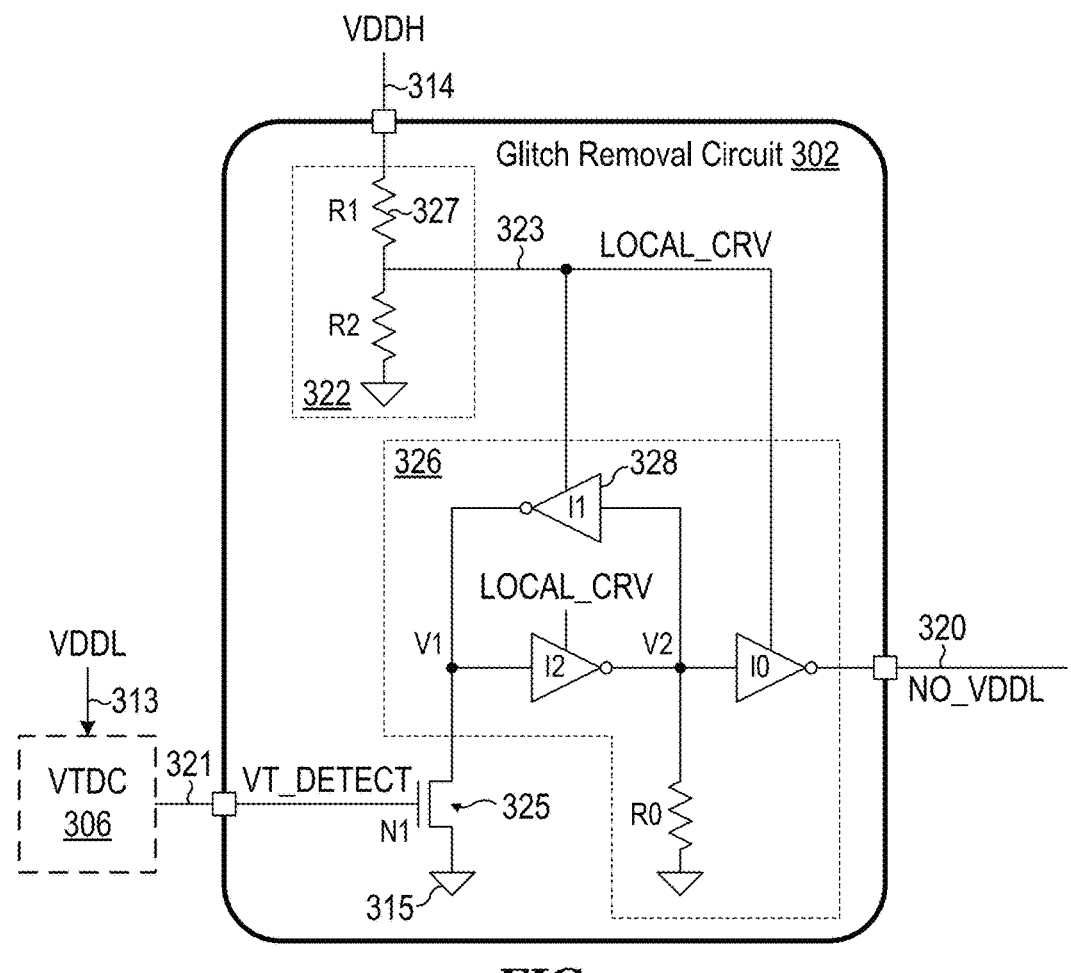
FIG. 3 illustrates another example glitch removal circuit that includes a latch circuit implemented using inverters and a voltage detection switch implemented using an n-type metal-oxide-semiconductor (NMOS) transistor in accordance with implementations of the invention.
FIG. 4 illustrates a qualitative timing diagram of an example glitch removal circuit showing high voltage, low voltage, internal voltage, detected voltage, and the corresponding missing low-voltage signal output from the glitch removal circuit in accordance with implementations of the invention.

FIG. 3 illustrates another example glitch removal circuit that includes a latch circuit implemented using inverters and a voltage detection switch implemented using an n-type metal-oxide-semiconductor (NMOS) transistor in accordance with implementations of the invention. The glitch removal circuit of FIG. 3 may be a specific implementation of other glitch removal circuits described herein, such as the glitch removal circuit of FIG. 2, for example. Similarly labeled elements may be as previously described.

Referring to FIG. 3, a glitch removal circuit 302 includes a voltage divider circuit 322 coupled to a high-voltage input 314 configured to receive a high voltage VDDH, a detected-voltage input 321 configured to receive a detection signal VT_DETECT (which may be generated by a voltage threshold detection circuit 306 configured to receive a low voltage VDDL), a latch circuit 326 configured to receive an internal voltage 323 (LOCAL_CRV) generated by the voltage divider circuit 322 and output a missing low-voltage signal 320 (NO_VDDL) when VDDH is present, but VDDL is absent. A voltage detect switch 325 (implemented in this specific example as NMOS switch N1 with a gate input coupled to VT_DETECT) is coupled between a node V1 of the latch circuit 326 and a reference ground voltage 315, as shown.

As an example, a specific arrangement of resistors 327 and inverters 328 is provided for the voltage divider circuit 322 and the latch circuit 326 (although of course additional components and other arrangements are possible). In this particular implementation, the latch circuit 326 is a latch-based inverter structure that includes a first inverter I1 and a second inverter I2 coupled in a loop (i.e., the output of I1 is coupled to the input of I2 and vice versa). The output of I1 is also coupled to the voltage detect switch 325 (the node V1). A resistor R0 is coupled to the output of I2 (node V2), which is also coupled to the input of a third inverter I0 (e.g., an output inverter). The voltage divider circuit 322 includes two resistors (R1 and R2) coupled in series between the high-voltage input 314 and the reference ground voltage 315 with the internal voltage 323 being output from between the two resistors.

FIG. 4 illustrates a qualitative timing diagram of an example glitch removal circuit showing high voltage, low voltage, internal voltage, detected voltage, and the corresponding missing low-voltage signal output from the glitch removal circuit in accordance with implementations of the invention. The timing diagram of FIG. 4 may qualitatively describe the time-dependent behavior of various signals within any of the glitch removal circuits described herein, such as the glitch removal circuit of FIG. 1 for example. Similarly labeled elements may be as previously described.

Referring to FIG. 4, a timing diagram 400 shows qualitative voltage traces over time for a glitch removal circuit. Specifically, the high voltage 414 (VDDH), the low voltage 413 (VDDL), the internal voltage 423 (LOCAL_CRV), the detected-voltage input 421 (VT_DETECT), and the missing low-voltage signal 420 (NO_VDDL) are shown. The output of the glitch removal circuit is NO_VDDL and is based on the states (high or low, present or absent, detected or not detected, etc.) of the two power inputs VDDH and VDDL.

Four cases may then be identified that iterate through the possible combinations high and low states for VDDH and VDDL. In addition to these four cases being demonstrated in the timing diagram 400, each possible order of supplying or removing VDDH and VDDL is also shown (i.e., VDDH before VDDL or "high first" and VDDL before VDDH or "low first"). For the purposes of explanation, reference will be made to the glitch removal circuit 302 of FIG. 3. However, it should be understood that other configurations are possible that may be configured to produce the same or similar behavior.

In the first case (Case 1), both VDDH and VDDL are low (e.g., nominally 0 V). When the VDDL supply is down, the detection signal indicates that VDDL is absent (i.e., the output of the voltage threshold detection circuit is unknown). Additionally, because the VDDH supply is also down, the output of the voltage divider circuit is also unknown and the inverters of the latch circuit (I0, I1, and I2) are not powered. The end result is the NO_VDDL is in the 1'bX state (shown here is no output) when both supplies are absent.

In the second case (Case 2), VDDH is low and VDDL is high. In this situation, the VDDL supply is up and the voltage threshold detection circuit enables the NMOS device N1, which pulls the voltage at the node V1 to 0 V. Because the VDDH supply is 0 V, the voltage divider circuits again outputs an undefined LOCAL_CRV and does not power the inverters I0, I1, and I2. The voltage at the node V2 is also pulled to 0 V by the resistor R0. The output NO_VDDL of the glitch removal circuit in Case 2 remains at the 1'bX state as the output inverter I0 is not powered.

In the third case (Case 3), VDDH is high and VDDL is low (i.e., Case 3 is an example of a situation that may damage low-voltage circuitry and occurs in the high first order of delivering and removing power, as shown). In this case, the VDDL supply is down and the output of the voltage threshold detection circuit is unknown. The output of the voltage divider circuit LOCAL_CRV is defined by the relative resistance values of the resistors R1 and R2, such as half of VDDH when R1 and R2 are the same (e.g., 1.8 V/2=0.9 V in one implementation). The NMOS device N1 is disabled and V2 is pulled down to 0 V by R0 so the inverter loop (I1 and I2) latches V1 to LOCAL_CRV (e.g., 0.9 V).

The output inverter I0 asserts the glitch removal circuit output to be LOCAL_CRV (e.g., 0.9 V). Practically speaking, this may have the advantage of cleanly defining devices, such as NMOS transistors, that are connected to power ok signals of a power check circuit to 0 V and avoid undesirable glitches that could propagate to an associated input/output circuit of a PSIS system.

In the fourth case (Case 4), both VDDH and VDDL are high. Since the VDDL supply is up, the voltage threshold detection circuit outputs the detection signal VT_DETECT as high and enables N1, which pulls V1 to 0 V. That is, the resistance of the resistor R0 may be such that current flows through N1 and V1 is latched to 0 V. Concurrently, the VDDH supply is also high, so the voltage divider circuit outputs a scaled version of VDDH as LOCAL_CRV (e.g., 0.9 V) and powers the inverters (I0, I1, and I2) in the latch circuit. The inverter I2 inverts V1 to make V2 equal to LOCAL_CRV and then the output inverter I0 inverts V2 to assert the glitch removal circuit output to be 0 V. Again, from a practical perspective, this may have the advantage of cleanly defining devices, such as NMOS transistors, that are connected to power ok signals of a power check circuit to 0 V to known values and avoid undesirable glitches that could propagate to an associated input/output circuit of a PSIS system.

Figure 5:
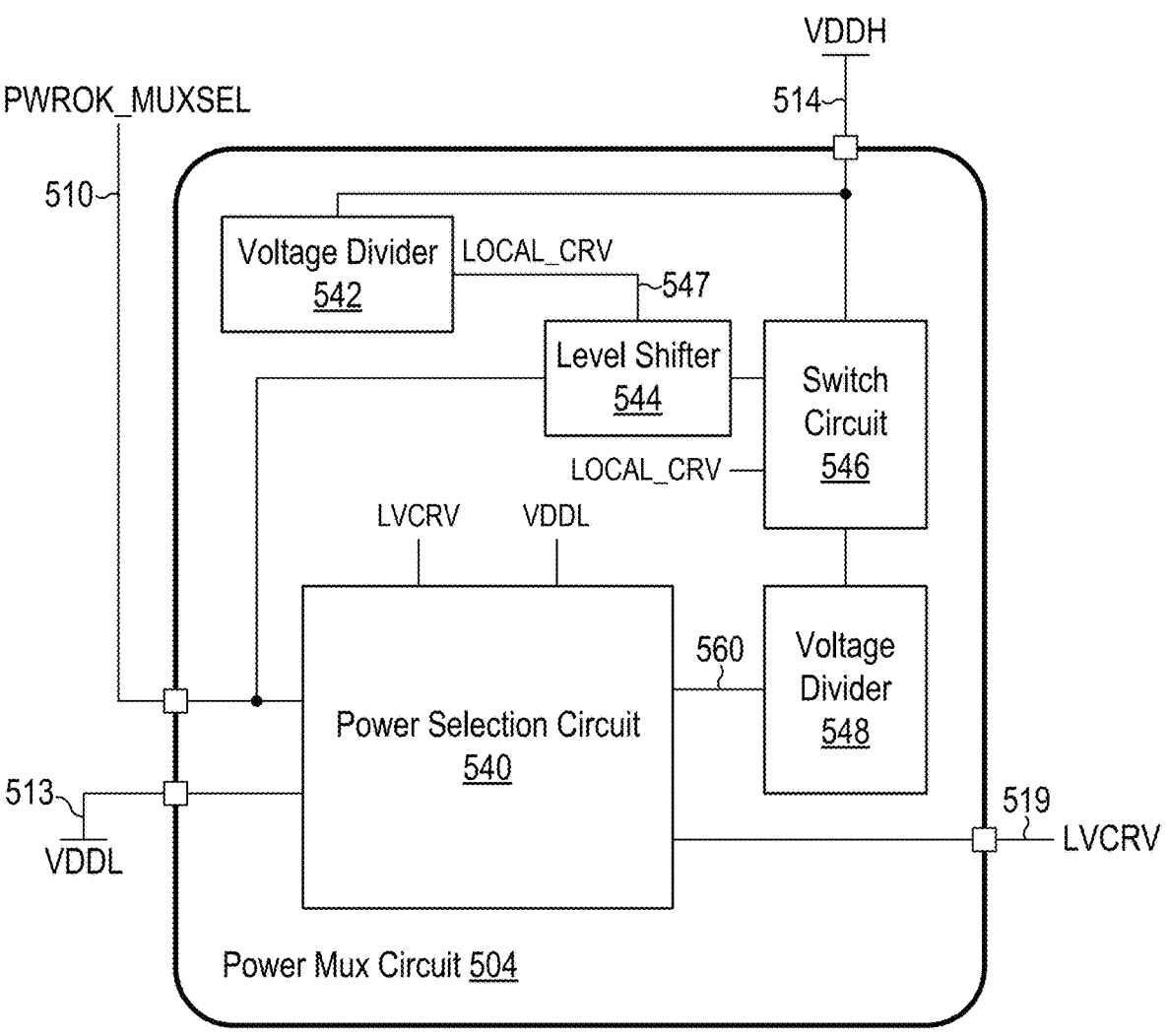
FIG. 5 illustrates an example power mux circuit that includes a power selection configured to receive a selection signal and output a scaled voltage generated from supply voltage received at a high-voltage input or a supply voltage received at a low-voltage input according to the selection signal in accordance with implementations of the invention.

FIG. 5 illustrates an example power mux circuit that includes a power selection configured to receive a selection signal and output a scaled voltage generated from supply voltage received at a high-voltage input or a supply voltage received at a low-voltage input according to the selection signal in accordance with implementations of the invention. The power mux circuit of FIG. 5 may be a specific implementation of other power mux circuits described herein, such as the power mux circuit of FIG. 1, for example. Similarly labeled elements may be as previously described.

Referring to FIG. 5, a power mux circuit 504 includes a selection signal 510 (PWROK_MUXSEL), a low-voltage input 513 configured to receive a low voltage (VDDL), and a high-voltage input 514 configured to receive a high voltage (VDDH). For example, the power mux circuit 504 may receive the selection signal 510 from a power check circuit and generate the selection signal 510 using a glitch removal circuit. A voltage divider circuit 542 receives VDDH and outputs an internal voltage 547 (i.e., an intermediate voltage LOCAL_CRV that is between VDDH and the reference ground, such as half of VDDH).

The power mux circuit 504 also includes a power selection circuit 540 that is coupled to the selection signal 510 and the low-voltage input 513. The power selection circuit 540 is configured to generate an intermediate voltage (LVCRV) at a power output 519 that is according to the state of the selection signal 510. For example, the power selection circuit 540 may provide a certain voltage (e.g., VDDL) at the power output 519 when PWROK_MUXSEL is high and output another voltage (e.g., a scaled voltage 560 generated from VDDH, which may be similar or nominally similar to VDDL) at the power output 519 when PWROK_MUXSEL is low.

The scaled voltage 560 may be generated using a voltage divider circuit 548 that is coupled to the high-voltage input 514 and receives VDDH through a switch circuit 546. For example, a voltage divider circuit 542 may also be coupled to the high-voltage input 514 and configured to generate an internal voltage 547 (LOCAL_CRV) at an output. The voltage divider circuit 542 may provide LOCAL_CRV to various components in the power mux circuit 504, such as a level shifter circuit 544 and a switch circuit 546 that is coupled between the high-voltage input 514 and the voltage divider circuit 548. The switch circuit 546 may be configured to control when the voltage divider circuit 548 receives VDDL, such as by using an output of the level shifter circuit 544 and LOCAL_CRV as input.

Figure 6:
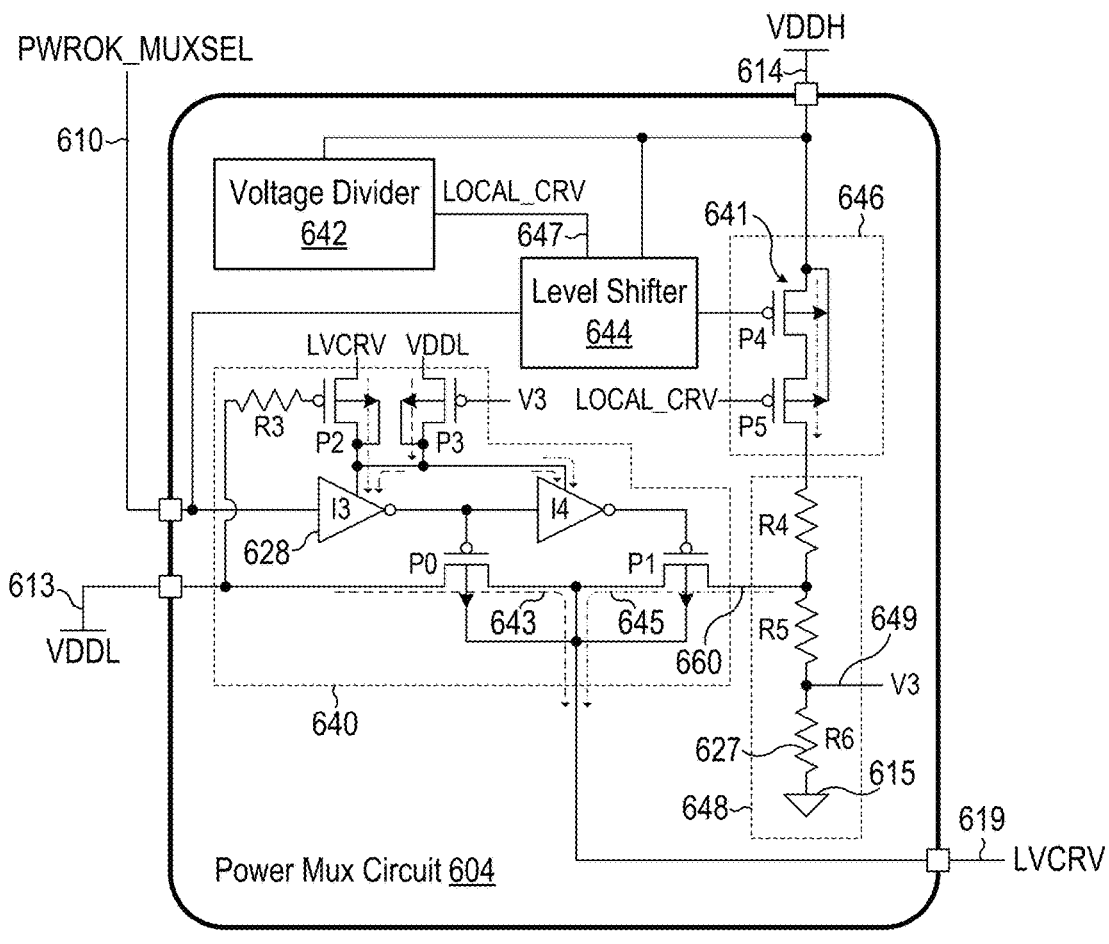
FIG. 6 illustrates another example power mux circuit that includes a power selection circuit implemented using inverters and p-type metal-oxide-semiconductor (PMOS) transistors according to implementations of the invention.

FIG. 6 illustrates another example power mux circuit that includes a power selection circuit implemented using inverters and PMOS transistors according to implementations of the invention. The power mux circuit of FIG. 6 may be a specific implementation of other power mux circuits described herein, such as the power mux circuit of FIG. 5, for example. Similarly labeled elements may be a previously described.

Referring to FIG. 6, a power mux circuit 604 includes a selection signal 610 (PWROK_MUXSEL), a low-voltage input 613 configured to receive a low voltage (VDDL), and a high-voltage input 614 configured to receive a high voltage (VDDH). For example, the power mux circuit 604 may receive the selection signal 610 from a power check circuit and generate the selection signal 610 using a glitch removal circuit. As before, the power mux circuit 604 also includes a power selection circuit 640 that is configured to generate an intermediate voltage (LVCRV) at a power output 619 according to the state of the selection signal 610. The power selection circuit 640 may receive a scaled voltage 660 from a voltage divider circuit 648 that receives VDDH through a switch circuit 646. A voltage divider circuit 642 that is configured to output an internal voltage 647 (LOCAL_CRV) and a level shifter circuit 644 may be used to generate signals used by the switch circuit 646 to control when VDDH reaches the voltage divider circuit 648.

As an example, a specific arrangement of resistors 627, inverters 628, and PMOS transistors 641 is provided for the power selection circuit 640, the switch circuit 646, and the voltage divider circuit 648 (although of course additional components and other arrangements are possible). In this particular implementation, the power selection circuit 640 includes a first inverter I3 with an input coupled to the selection signal 610 and an output coupled to the input of a second inverter I4.

The output of the inverter I3 is also coupled to the control input of a first switch P0 (e.g., the gate of a PMOS device in this example). The first switch P0 is configured to be open (i.e., disabled) when the selection signal is in a first state (e.g., low) and closed (i.e., enabled) when the selection signal is in a second state (e.g., high). For example, the first switch may be coupled between the low-voltage input 613 and the power output 619 so as to control the flow of current therebetween. Similarly, the output of the inverter I4 is coupled to the control input of a second switch P1 that is configured to be open (i.e., disabled) when the selection signal is in the second state (e.g., high) and closed (i.e., enabled) when the selection signal is in the first state (e.g., low). The second switch P1 may also control the flow of current to the power output 619, such as from the voltage divider circuit 648, as shown in this implementation.

The power selection circuit 640 may further include a third switch P2 with a control input that is coupled to the low-voltage input 613 (e.g., through a resistor R3, as shown). The third switch P3 may have an input coupled to the power output 619 and have an output coupled to the inputs of the inverters I3 and I4, so as to use LVCRV to power the inverters when the third switch P2 is closed (e.g., when VDDL is absent). For example, when the third switch P2 is closed, the second switch P1 may also be closed and a LVCVR path 645 may described the flow of current in the power selection circuit 640.

A fourth switch P3 may also be included with a control input that is coupled a second internal voltage 649 (V3). The fourth switch P3 may have an input coupled to the low-voltage input 613 and have an output coupled to the power outputs of the inverters I3 and I4, so as to use VDDL to power the inverters with the fourth switch P3 is closed (e.g., when both VDDH and VDDL are present). For example, when the fourth switch P3 is closed, the first switch P0 may also be closed and a VDDL path 643 may described the flow of current in the power selection circuit 640.

The second internal voltage 649 may be generated by the voltage divider circuit 648 (e.g., in addition to the scaled voltage 660), such as by using three resistors R4, R5, and R6 coupled between the switch circuit 646 and a reference ground voltage 615. The relative values of R4, R5, and R6 may be chosen to provide the appropriate scaling of VDDH to generate the scaled voltage 660 (e.g., at half VDDH, such as nominally 0.9 V) and the second internal voltage 649 (e.g., at a voltage lower than the scaled voltage 660, such as 0.385 V, for example). In one implementation, the resistance of the resistor R4 is R and the resistances of the resistor R5 and the resistor R6 is 0.375*R. The value of R may be chosen in such a way as to avoid providing more current than is required (e.g. for efficiency).

The switch circuit 646 may include an input coupled to the high-voltage input 614 and include output coupled to the voltage divider circuit 642 (i.e., configured to receive LOCAL_CRV, as shown). The switch circuit 646 may be configured to allow current to pass through the switch circuit 646 to the voltage divider circuit 648 when VDDH is present and VDDL is absent. For example, the switch circuit 646 may include a fifth switch P4 with a control input coupled to the level shifter circuit 644 and a sixth switch P5 with a control input coupled to the output of the voltage divider circuit 642 (LOCAL_CRV).

Figure 7:
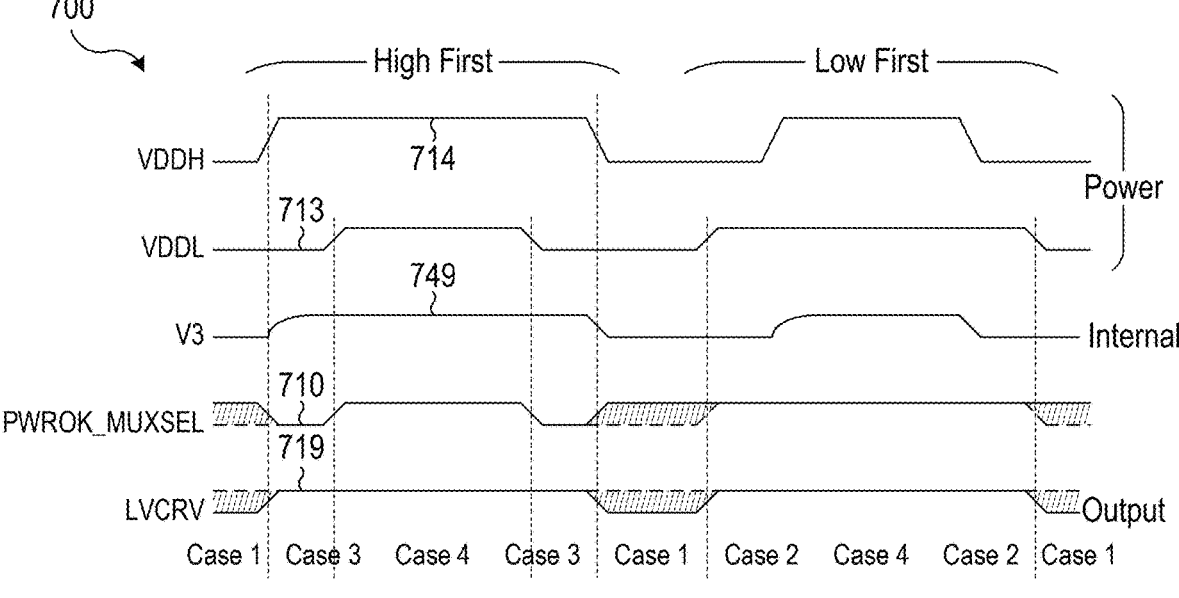
FIG. 7 illustrates a qualitative timing diagram of an example power mux circuit showing high voltage, low voltage, internal voltage, the selection signal received by the power mux circuit, and the intermediate voltage output by the power mux circuit in accordance with implementations of the invention.

FIG. 7 illustrates a qualitative timing diagram of an example power mux circuit showing high voltage, low voltage, internal voltage, the selection signal received by the power mux circuit, and the intermediate voltage output by the power mux circuit in accordance with implementations of the invention. The timing diagram of FIG. 7 may qualitatively describe the time-dependent behavior of various signals within any of the power mux circuits described herein, such as the power mux circuit of FIG. 1 for example. Similarly labeled elements may be as previously described.

Referring to FIG. 7, a timing diagram 700 shows qualitative voltage traces over time for a power mux circuit. Specifically, the high voltage 714 (VDDH), the low voltage 713 (VDDL), the internal voltage 749 (V3), the selection signal 710 (PWROK_MUXSEL), and the power output 719 (LVCRV) are shown. The output of the glitch removal circuit is LVCRV and is based on the states (high or low, present or absent, detected or not detected, etc.) of the two power inputs VDDH and VDDL and the selection signal PWROK_MUXSEL.

Four cases may then be identified that iterate through the possible combinations high and low states for VDDH and VDDL. The state of the PWROK_MUXSEL may also affect LVCRV, but it may also be controlled directly or indirectly by the states of VDDH and VDDL (e.g., by a power check circuit). For this reason, the below description focuses on the states of VDDH and VDDL. As before, each possible order of supplying or removing VDDH and VDDL is also shown. For the purposes of explanation, reference will be made to the power mux circuit 604 of FIG. 6. However, it should be understood that other configurations are possible that may be configured to produce the same or similar behavior.

In the first case (Case 1), both VDDH and VDDL are low (e.g., nominally 0 V). When the VDDL supply is down, PWROK_MUXSEL is unknown and the voltage divider circuit 642 is not powered. As a result, LOCAL_CRV is undefined and does not power the level shifter circuit 644 and the switches of the switch circuit (P4 and P5) are not turned on (i.e., remain open disallowed current to flow). Therefore, the output of the power mux circuit LVCRV remains as an unknown (1b'X state) when neither voltage supply is present.

In the second case (Case 2), VDDH is low and VDDL is high. In this situation, the VDDL supply is up and PWROK_MUXSEL is high (e.g., nominally 0.9 V, such as from a power check circuit, for example). But because the VDDH supply is still absent, the output of the voltage divider circuit 642 is still undefined and no current reaches the voltage divider circuit 648. P2 is disabled (since VDDL is present), but P3 is enabled as the internal voltage 749 (V3) is zero, allowing the inverters I3 and I4 to receive power from VDDL. PWROK_MUXSEL is inverted to low by I3 (turning on P0) and inverted again to high by I4 (turning off P1). The VDDL path is enabled and LVCRV follows the VDDL supply (e.g., nominally 0.9 V). Because P1 is disabled, there is no current path between the VDDH and the VDDL power supplies.

In the third case (Case 3), VDDH is high and VDDL is low (i.e., Case 3 is an example of a situation that may damage low-voltage circuitry and occurs in the high first order of delivering and removing power, as shown). In this case, the VDDL supply is down, but PWROK_MUXSEL is low (e.g., 0 V), rather than unknown, such as with the help of a glitch removal circuit. The output of the voltage divider circuit 642 (LOCAL_CRV) is defined because VDDH is present and the level shifter circuit 644 is powered, which enables both the P4 and the P5 devices. The voltage divider circuit 648 receives VDDH and generates a scaled voltage at P1.

The internal voltage 749 (V3) is generated and P3 is turn off. However, P2 is now turned on since VDDL is absent and the inverters I3 and I4 are powered by LVCRV. In this circumstance, PWROK_MUXSEL is low and is inverted to high by I3 (turning off P0) and inverted again to low by I4 (turning on P1). The LVCRV path is enabled and LVCRV follows a scaled version of the VDDH supply (e.g., nominally 1.8/2=0.9 V). Because P0 is disabled, there is no current path between the VDDH and the VDDL supplies. This method of intermediate supply generation may have the advantage of helping to avoid electrical over-stress on low-voltage devices (such as 1.5 V I/O devices) during PSIS (power supply independent sequencing) where the VDDH (e.g., VDD18) is present and VDDL (e.g., VDDC) is absent.

In the fourth case (Case 4), both VDDH and VDDL are high. Since the VDDL supply is up, PWROK_MUXSEL is high (e.g., 0.9 V). The VDDH supply is also up so LOCAL_CRV is defined to a known voltage (e.g., 0.9 V) and the level shifter circuit 644 receives power and disables the P4 device. VDDL being present disables P2, but P3 is enabled because no current reached V3. The inverters I3 and I4 are powered by VDDL and PWROK_MUXSEL is inverted to turn P0 on so that the VDDL path is enabled. The output LVCRV again follows the VDDL supply. P1 is disabled by inverter I4 and there is again no current path between the VDDH and the VDDL power supplies.

Figure 8:
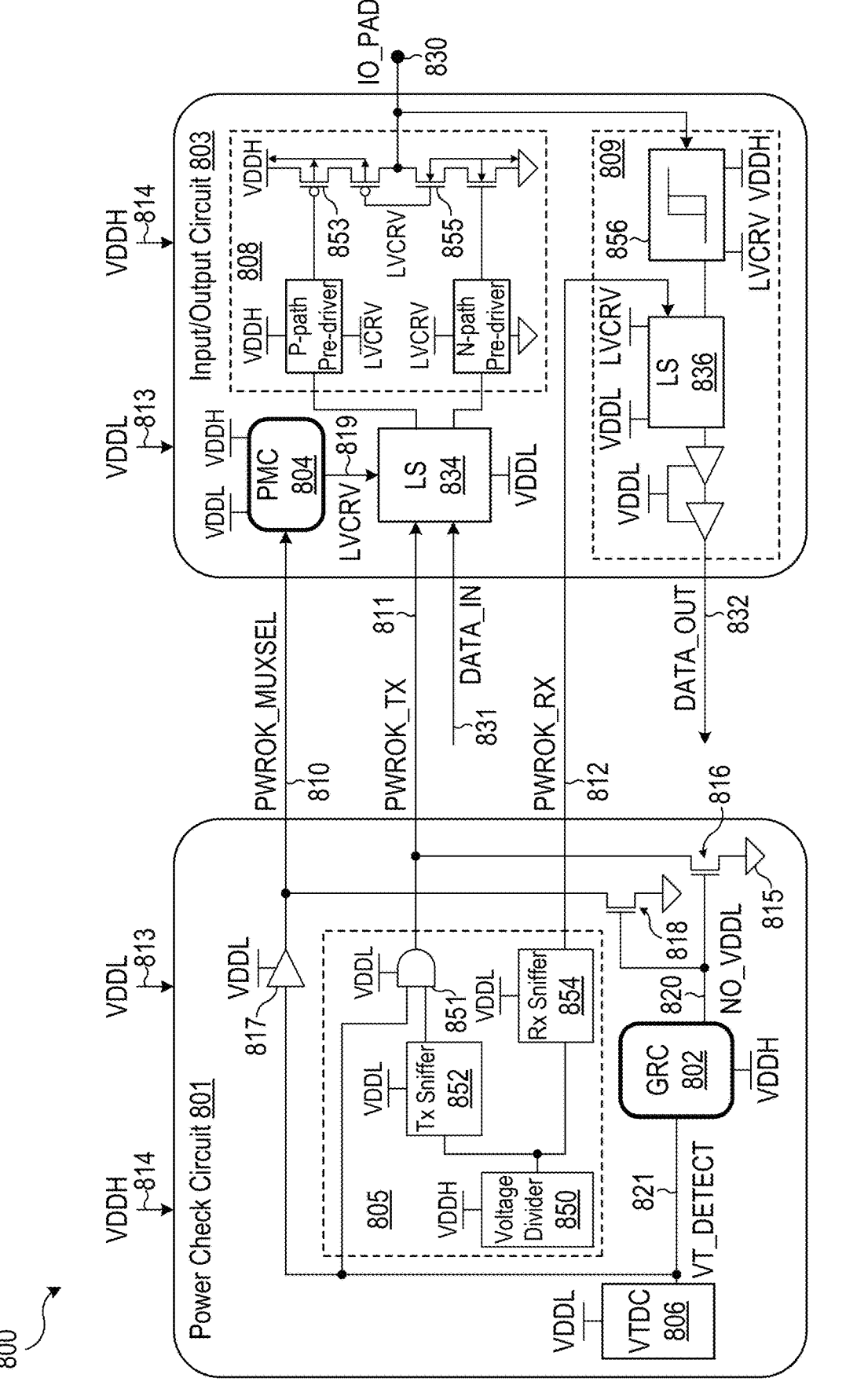
FIG. 8 illustrates another example PSIS system that includes a power check circuit with a glitch removal circuit configured to provide a missing low-voltage signal to a power mux circuit of an input/output circuit, the missing low-voltage signal indicating that a high voltage supply is present and a low voltage supply is absent in accordance with implementations of the invention.

FIG. 8 illustrates another example PSIS system that includes a power check circuit with a glitch removal circuit configured to provide a missing low-voltage signal to a power mux circuit of an input/output circuit, the missing low-voltage signal indicating that a high voltage supply is present and a low voltage supply is absent in accordance with implementations of the invention. The PSIS system of FIG. 8 may be a specific implementation of other PSIS systems described herein, such as the PSIS system of FIG. 1, for example. Similarly labeled elements may be as previously described.

Referring to FIG. 8, a PSIS system 800 includes a power check circuit 801 and an input/output circuit 803. The PSIS system 800 is configured to receive or generate a low-voltage supply (VDDL) and a high-voltage supply (VDDH) that are each provided to the power check circuit 801 and the input/output circuit 803 at a corresponding low-voltage input 813 and a high-voltage input 814 of each of the circuits and is then provided to various components therein. The input/output circuit 803 may act as an interface between circuitry, including an input/output pad 830 (IO_PAD) that is configured to transmit and receive data (e.g., from a high-voltage domain, such as a 1.8 V domain, for example). Accordingly, the input/output circuit 803 may also include a data input 831 and a data output 832 that are configured to receive and transmit data, respectively, from another voltage domain (e.g., from a low-voltage domain, such as a 0.9 V domain, for example).

In this specific implementation, the power check circuit 801 generates and outputs a power ok transmission signal 811 (PWROK_TX) to the input/output circuit 803 to indicate whether it is safe to enable a transmission circuit 808 included in communication circuitry of the input/output circuit 803. Similarly, the power check circuit 801 generates and outputs a power ok reception signal 812 (PWROK_RX) to the input/output circuit 803 to indicate whether it is safe to enable a reception circuit 809 included in the communication circuitry. A power sniffer circuit 805 of the power check circuit 801 generates both PWROK_TX and PWROK_RX, such as by monitoring VDDH and VDDL.

The power check circuit 801 of the PSIS system 800 also includes a glitch removal circuit 802 configured to remove glitches that occur when power is delivered in a different order. Specifically, the glitch removal circuit 802 is configured to output a missing low-voltage signal 820 (NO_VDDL) when the high voltage (VDDH) is present, but the low voltage (VDDL) is absent. The input/output circuit 803 includes a power mux circuit 804 that is coupled to the PWROK_MUXSEL (the selection signal 810). The power mux circuit 804 is also coupled to both the low voltage VDDL and the high voltage VDDH and is configured to generate an intermediate voltage (LVCRV) at a power output 819 using VDDH or VDDL. In this way, the power mux circuit 804 may generate the intermediate voltage when one or both of VDDH and VDDL are present advantageously preventing the full voltage difference between the reference ground voltage and the high voltage from being experienced by low-voltage circuitry.

The glitch removal circuit 802 has a detected-voltage input 821 coupled to a voltage threshold detection circuit 806 that is configured to generate VT_DETECT when the low voltage (VDDL) meets or exceeds the predetermined threshold. The power check circuit 801 also generates and outputs a selection signal 810 (PWROK_MUXSEL) that is used by the input/output circuit 803. The selection signal 810 is generated from the detection signal VT_DETECT, which is passed through a buffer 817 powered by the low voltage VDDL. In this specific implementation, PWROK_TX and PWROK_MUXSEL are modified by the glitch removal circuit 802. Specifically, the missing low-voltage signal 820 NO_VDDL is coupled to the control input of an ok transmission switch 816 and a mux selection switch 818 (implemented as NMOS transistors 855) coupled between PWROK_TX and PWROK_MUXSEL (respectively) and a reference ground voltage 815.

Although the details of the power sniffer circuit 805 may vary from implementation to implementation, in this specific example, the power sniffer circuit 805 includes a voltage divider circuit 850 with an input coupled to the high-voltage input 814 and an output coupled to inputs of both a transmission sniffer circuit 852 and a reception sniffer circuit 854. The reception sniffer circuit 854 outputs PWROK_RX while the output of the transmission sniffer circuit 852 is coupled to an input of an AND gate 851 whose other input is VT_DETECT and whose output is PWROK_TX. That is, when VT_DETECT and the transmission sniffer circuit 852 output are both high, PWROK_TX is high (and is low otherwise).

The input/output circuit 803 includes a transmission level shifter circuit 834 coupled to the data input 831 and PWROK_TX (the power ok transmission signal 811). The output(s) of the transmission level shifter circuit 834 are coupled to the transmission circuit 808. In this specific implementation, the transmission circuit 808 includes p-path and n-path pre-drivers coupled between VDDH and LVCRV and between LVCRV and the reference ground voltage, respectively. The output of the p-path pre-driver is coupled to a control input of one of a pair of PMOS transistors 853, the control input of the other being coupled to LVCRV. Symmetrically, the output of the n-path pre-driver is coupled to the control input of one of a pair of NMOS transistors 855 and the control input of the other is also coupled to LVCRV.

Similarly, the input/output circuit 803 also includes a reception level shifter circuit 836 coupled to the data output 832 and PWROK_RX (the power ok reception signal 812). The reception circuit 809 includes a trigger circuit 856 (such as a Schmitt trigger circuit) that is coupled to both VDDH and LVCRV and has an input coupled to the input/output pad 830 and an input of the reception level shifter circuit 836. An output of the reception level shifter circuit 836 is coupled to a pair of buffer circuits arranged in series between the reception level shifter circuit 836 and the data output 832, both of which are powered by VDDL.

Figure 9:
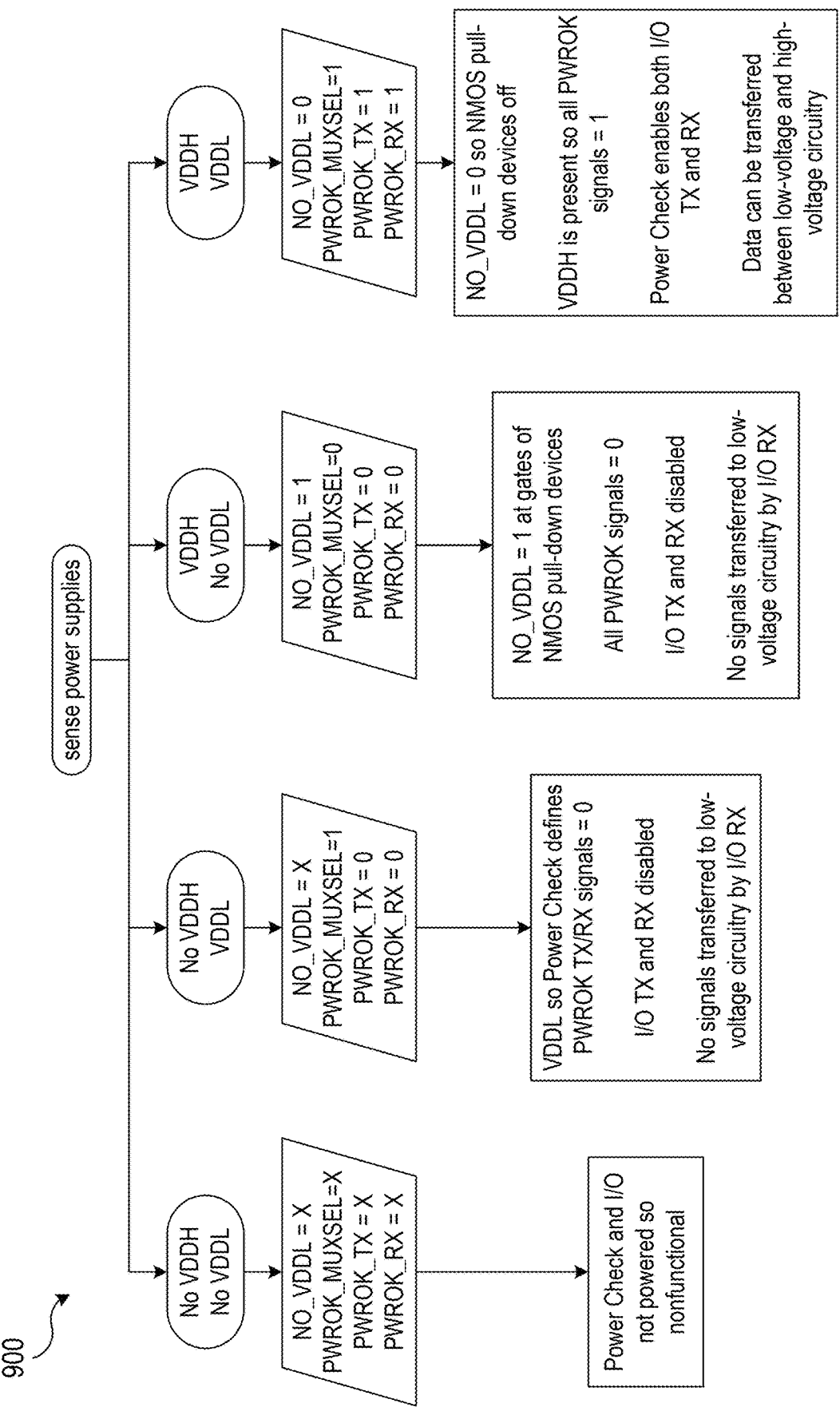
FIG. 9 illustrates a flowchart of the behavior of an example PSIS system in accordance with implementations of the invention.

FIG. 9 illustrates a flowchart of the behavior of an example PSIS system in accordance with implementations of the invention. The flowchart of FIG. 9 may qualitatively describe the behavior of any of the PSIS systems described herein, such as the PSIS system of FIG. 1 for example. Similarly labeled elements may be as previously described.

Referring to FIG. 9, a flowchart 900 provides one example of the possible behavior of PSIS system with a power check circuit that has a glitch removal circuit and an input/output circuit that has a power mux circuit. As shown, the power supplies (i.e., the high-voltage supply VDDH and the low-voltage supply VDDL) are initially sensed, such as by a sniffer circuit and a voltage threshold detection circuit of a power check circuit. As discussed above (such as in FIGS. 4 and 7) there are four possible cases.

In the far left, there is no sensed power (both VDDH and VDDL are zero or at least below a certain threshold). All power ok signals (PWROK_MUXSEL, PWROK_TX, and PWROK_RX) as well as the output of the glitch removal circuit NO_VDDL are all unknown. In this case, neither the power check circuit nor the input/output circuit are functional (and of course are not expected to be).

Next from the left, VDDH is absent and VDDL is present. In this case, PWROK_MUXSEL is defined to be high ("1") while both PWROK_TX and PWROK_RX are defined to be low ("0"). Because VDDL is available (but not VDDH), the power sniffer circuit defines PWROK_TX and PWROK_RX as zero, which disables communication circuitry in the input/output circuit preventing unwanted signals from being transferred to low-voltage circuitry by the input/output circuit (e.g., by a reception circuit). As discussed above, this case results in NO_VDDL being undefined (e.g., because the latch circuit in the glitch removal circuit is not powered). Notably, the output LVCRV of the power mux circuit is still defined to be VDDL in this case which ensures that devices are in a known state.

In the third case, VDDH is present and VDDL is absent. NO_VDDL is defined to be high and pulls down the power ok signals so that PWROK_MUXSEL, PWROK_TX, and PWROK_RX are all low. Again, the communication circuitry in the input/output circuit is disabled and preventing unwanted signals from being transferred to low-voltage circuitry by the input/output circuit (e.g., by a transmission circuit). The output LVCRV of the power mux circuit is defined to be a scaled version of VDDH (such as VDDH/2) in this case which ensures that devices are in a known state.

At the far right, both VDDH and VDDL are present (a case in which it is safe to enable communication circuitry in the input/output circuit). Because VDDL is present and all circuitry in the glitch removal circuit is powered, NO_VDDL is zero. The power check circuit accurately outputs the power ok signals as high. The input/output circuit enables communication circuitry and data can be transferred between the low-voltage circuitry and external circuitry.

While this invention has been described with reference to illustrative implementations, this description is not intended to be construed in a limiting sense. Various modifications and combinations of the illustrative implementations, as well as other implementations of the invention, will be apparent to persons skilled in the art upon reference to the description. It is therefore intended that the appended claims encompass any such modifications or implementations.

What is claimed is:

1. An electronic circuit comprising:
a high-voltage input configured to receive a first voltage;
a voltage divider circuit coupled to the high-voltage input and configured to generate an internal voltage from the first voltage and that is lower than the first voltage;
a detected-voltage input configured to receive a detected voltage that is lower than the first voltage; and
a latch circuit coupled to the internal voltage and the detected-voltage input, the latch circuit being configured to, when the first voltage is received at the high-voltage input,
output the internal voltage when the detected voltage is zero, and
output zero voltage when the detected voltage is non-zero.

2. The electronic circuit of claim 1, further comprising:
a voltage detection switch coupled between the latch circuit and a reference ground voltage, the switch being configured to pull the internal voltage received by the latch circuit to the reference ground voltage when the detected voltage is at or above a predefined threshold.

3. The electronic circuit of claim 2, wherein the switch is an n-type metal-oxide-semiconductor device.

4. The electronic circuit of claim 2, wherein the latch circuit comprises a first inverter and a second inverter coupled in a loop, an output of the first inverter being coupled to the switch and an output of the second inverter being coupled to a pull-down resistor and to an input of a third inverter configured to output the internal voltage or zero voltage.

5. The electronic circuit of claim 1, further comprising:
a voltage threshold detection circuit comprising a low-voltage input configured to receive a second voltage lower than the first voltage, the voltage threshold detection circuit being configured to output the detected voltage as a detection signal that is zero when the second voltage is below a predefined threshold and that is the second voltage when the second voltage is at or above the predefined threshold.

6. The electronic circuit of claim 1, wherein the first voltage is double the detected voltage.

7. The electronic circuit of claim 6, wherein the first voltage is about 1.8 V and the detected voltage is about 0.9 V.

8. A power supply independent sequence (PSIS) system comprising:
a high-voltage input configured to receive a first voltage;
a low-voltage input configured to receive a second voltage lower than the first voltage;
a power check circuit configured to generate one or more power ok signals indicating that the first voltage or the second voltage is present, the power check circuit comprising
a voltage threshold detection circuit coupled to the low-voltage input and configured to output a detected voltage that is zero when the second voltage is below a predefined threshold and that is the second voltage when the second voltage is at or above the predefined threshold,
a glitch removal circuit coupled to the detected voltage and the high-voltage input, the glitch removal circuit comprising a voltage divider circuit configured to generate an internal voltage from the first voltage and lower than the first voltage, the glitch removal circuit being configured to
output a missing low-voltage signal as high when the first voltage is received at the high-voltage input and the second voltage is below the predefined threshold, and
output the missing low-voltage signal as low when the first voltage is received at the high-voltage input and the second voltage is at or above the predefined threshold, and
a pull-down switch comprising a control input coupled to the missing low-voltage signal and configured to pull at least one of the one or more power ok signals to a reference ground voltage when the missing low-voltage signal is high; and
an input/output circuit coupled to the one or more power ok signals and comprising communication circuitry, the input/output circuit being configured to disable the communication circuitry when the one or more power ok signals are low.

9. The PSIS system of claim 8, wherein
the power check circuit is further configured to output a selection signal; and
the input/output circuit comprises a power mux circuit coupled to the selection signal, the high-voltage input, and the low-voltage input, the power mux circuit and being configured to output an intermediate voltage between the first voltage and the reference ground voltage,
wherein the intermediate voltage is generated from the second voltage by the power mux circuit when the selection signal is in a first state, and
wherein the intermediate voltage is generated from the first voltage by the power mux circuit when the selection signal is in a second state.

10. The PSIS system of claim 9, wherein the input/output circuit further comprises:
an input/output pad;
a transmission level shifter circuit coupled to
a transmission power ok signal of the one or more power ok signals,
a data input of a transmission circuit of the communication circuitry, the transmission circuit being configured to transmit data at the input/output pad,
the low-voltage input, and
the intermediate voltage,
the transmission level shifter circuit being configured to shift voltage at the data input from the intermediate voltage to the first voltage when the transmission power ok signal is high; and
a reception level shifter circuit coupled to
a reception power ok signal of the one or more power ok signals,
a data output of a reception circuit of the communication circuitry, the reception circuit being configured to receive data at the input/output pad,
the high-voltage input, and
the intermediate voltage,
the reception level shifter circuit being configured to shift voltage at the data output from the first voltage to the intermediate voltage when the reception power ok signal is high.

11. The PSIS system of claim 8, wherein the first voltage is double the second voltage.

12. The PSIS system of claim 11, further comprising:

low-voltage circuitry configured to operate at the second voltage and fabricated at a technology node of 5 nm or lower.

13. The PSIS system of claim 12, wherein the first voltage is about 1.8 V and the second voltage is about 0.9 V.

14. The PSIS system of claim 8, wherein the input/output circuit comprises a power mux circuit comprising:

a first voltage divider circuit coupled to the high-voltage input and configured to generate a scaled voltage from the first voltage;

a selection input configured to receive a selection signal; and a power selection circuit coupled to the selection input, the scaled voltage, and the second voltage, the power selection circuit comprising a power output configured to output the scaled voltage or the second voltage according to the selection signal.

15. The PSIS system of claim 14, wherein the power selection circuit further comprises:

a first inverter comprising an input coupled to the selection signal;

a second inverter comprising an input coupled to an output of the first inverter;

a first switch comprising a control input coupled to the output of the first inverter, the first switch being configured to be open when the selection signal is in a first state and closed when the selection signal is in a second state; and a second switch comprising a control input coupled to an output of the second inverter, the second switch being configured to be open when the selection signal is in the second state and closed when the selection signal is in the first state.

16. The PSIS system of claim 14, wherein the power mux circuit further comprises:

a switch circuit comprising an input coupled to the high-voltage input, and an output coupled to the first voltage divider circuit, the switch circuit being configured to allow current to pass through the switch circuit to the first voltage divider circuit when the first voltage is present and the second voltage is absent.

17. A power supply independent sequence (PSIS) system comprising:

a high-voltage input configured to receive a first voltage;

a low-voltage input configured to receive a second voltage lower than the first voltage;

a power check circuit comprising a power sniffer circuit configured to generate one or more power ok signals indicating that the first voltage or the second voltage are present, a voltage threshold detection circuit coupled to the low-voltage input and configured to output a detected voltage that is zero when the second voltage is below a predefined threshold and that is the second voltage when the second voltage is at or above the predefined threshold, a glitch removal circuit coupled to the detected voltage and the high-voltage input, the glitch removal circuit configured to output a missing low-voltage signal as high when the first voltage is received at the high-voltage input and the second voltage is below the predefined threshold, and output the missing low-voltage signal as low when the first voltage is received at the high-voltage input and the second voltage is at or above the predefined threshold, and a pull-down switch comprising a control input coupled to the missing low-voltage signal and configured to pull at least one of the one or more power ok signals to a reference ground voltage when the missing low-voltage signal is high; and an input/output circuit coupled to the one or more power ok signals and comprising a power mux circuit configured to generate an intermediate voltage when one or both of the first voltage and the second voltage are non-zero, and communication circuitry comprising a transmission circuit and a reception circuit, the input/output circuit being configured to disable the communication circuitry when the one or more power ok signals are low.

18. The PSIS system of claim 17, wherein the glitch removal circuit comprises:

a voltage divider circuit coupled to the high-voltage input and configured to generate an internal voltage from the first voltage and that is lower than the first voltage;

a detected-voltage input configured to receive the detected voltage; and a latch circuit coupled to the internal voltage and the detected-voltage input, the latch circuit being configured to, when the first voltage is received at the high-voltage input, output the internal voltage when the detected voltage is zero, and output zero voltage when the detected voltage is non-zero.

19. The PSIS system of claim 17, wherein the power mux circuit comprises:

a voltage divider circuit coupled to the high-voltage input and configured to generate a scaled voltage from the first voltage;

a selection input configured to receive a selection signal; and a power selection circuit coupled to the selection input, the scaled voltage, and the second voltage, the power selection circuit comprising a power output configured to output the scaled voltage or the second voltage according to the selection signal.

20. The PSIS system of claim 17, wherein the power sniffer circuit comprises:

a voltage divider circuit coupled to the high-voltage input;

a transmission sniffer circuit configured to output a power ok transmission signal;

a reception sniffer circuit configured to output a power ok reception signal; and an AND gate coupled to the detected voltage and the transmission sniffer circuit, an output of the AND gate being the power ok transmission signal when the detected voltage is high.

* * * * *